(12) United States Patent
Tavallaee

(10) Patent No.: US 11,500,077 B2
(45) Date of Patent: Nov. 15, 2022

(54) PERTURBATIONS EXTERNAL TO A LASER CAVITY

(71) Applicant: SiLC Technologies, Inc., Monrovia, CA (US)

(72) Inventor: Amir Ali Tavallaee, San Francisco, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 563 days.

(21) Appl. No.: 16/660,748

(22) Filed: Oct. 22, 2019

(65) Prior Publication Data

US 2021/0116552 A1 Apr. 22, 2021

(51) Int. Cl.
| | | |
|---|---|---|
| *G01S 7/4912* | (2020.01) | |
| *G01S 7/481* | (2006.01) | |
| *G01S 17/89* | (2020.01) | |
| *H01S 3/08* | (2006.01) | |

(52) U.S. Cl.
CPC ............ *G01S 7/4912* (2013.01); *G01S 7/481* (2013.01); *G01S 17/89* (2013.01); *H01S 3/08031* (2013.01)

(58) Field of Classification Search
None
See application file for complete search history.

(56) References Cited

U.S. PATENT DOCUMENTS

| | | | | |
|---|---|---|---|---|
| 2015/0171593 A1* | 6/2015 | Duan | ................ | H01S 5/0656 |
| | | | | 372/50.1 |
| 2018/0287343 A1* | 10/2018 | Morrison | ............. | H01S 5/1209 |
| 2018/0375284 A1* | 12/2018 | Permogorov | ......... | H01S 3/1055 |
| 2019/0018197 A1* | 1/2019 | Boutami | .............. | G02B 6/14 |
| 2020/0076152 A1* | 3/2020 | Eichenholz | ........ | G02B 26/0816 |

OTHER PUBLICATIONS

Eblana Photonics, 2007, "Discrete mode laser diodes with ultra narrow linewidthe emission" 2 pgs.

* cited by examiner

*Primary Examiner* — Rebecca A Volentine
(74) *Attorney, Agent, or Firm* — Gavrilovich, Dodd & Lindsey LLP

(57) ABSTRACT

A laser system includes a resonant laser cavity configured to output a laser signal. The system also includes a utility waveguide configured to receive the laser signal from the laser cavity. The utility waveguide includes a perturbation region that is external to the laser cavity and receives the laser signal from the laser cavity and outputs a laser beam. The perturbation region includes one or more perturbation structures that each causes one or more perturbation(s) in the index of refraction of the utility waveguide. The perturbation structures are selected to provide optical feedback to the resonant laser cavity such that a power versus wavelength distribution in the laser beam is different from the power versus wavelength distribution that would be in the laser signal in the absence of the perturbation structures.

17 Claims, 8 Drawing Sheets

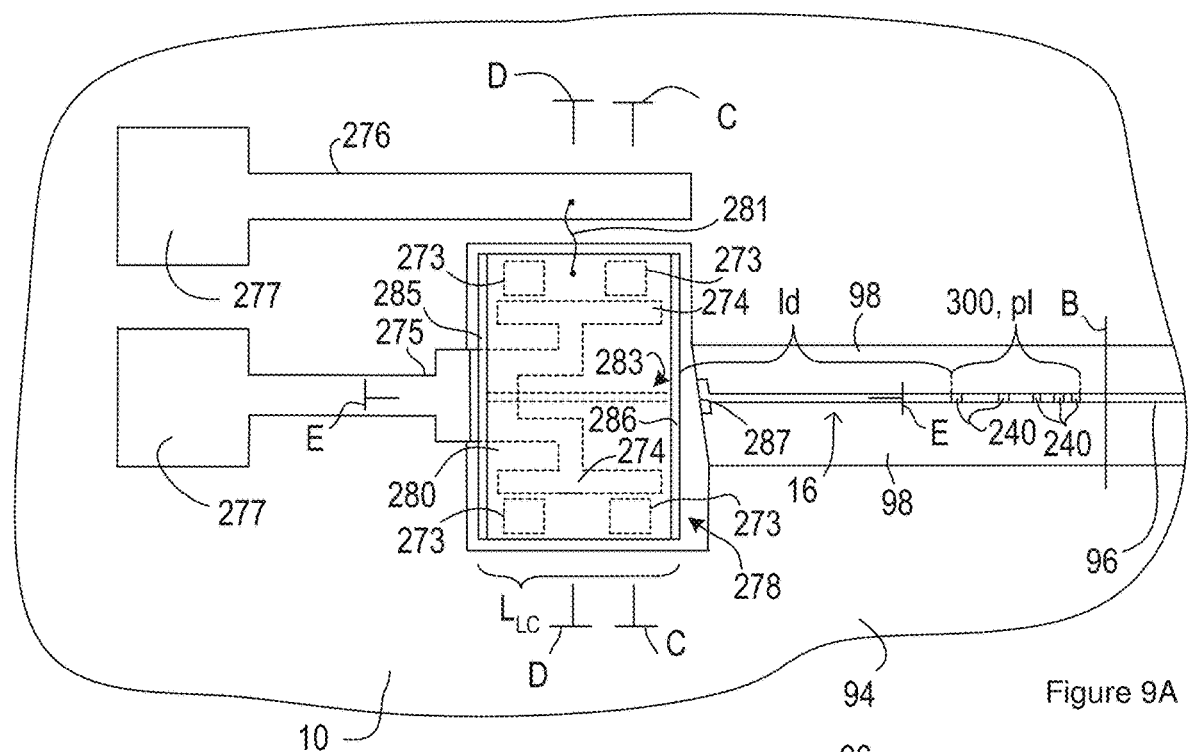
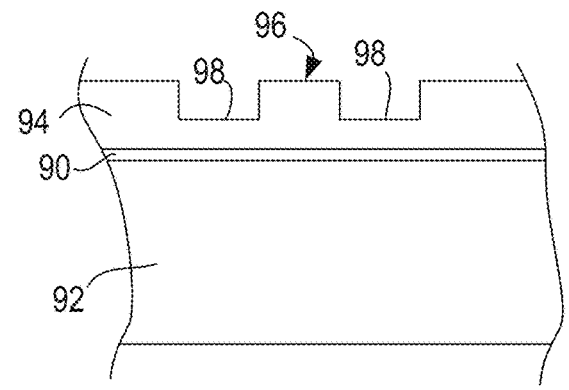
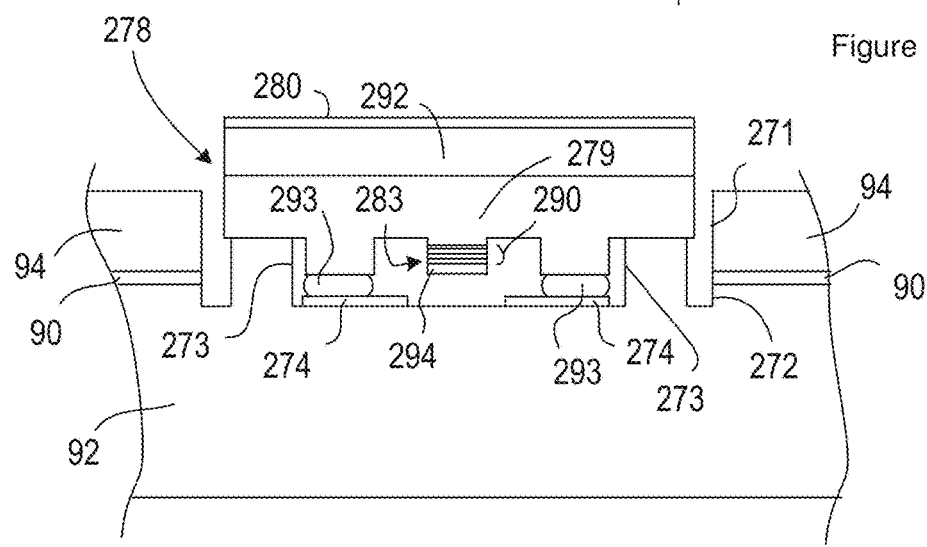
Figure 9A
Figure 9B
Figure 9C

PERTURBATIONS EXTERNAL TO A LASER CAVITY

FIELD

The invention relates to optical devices. In particular, the invention relates to laser systems.

BACKGROUND

There is an increasing commercial demand for 3D sensing systems that can be economically deployed in applications such as ADAS (Advanced Driver Assistance Systems) and AR (Augmented Reality). LIDAR (Light Detection and Ranging) sensors are used to construct a 3D image of a target scene by illuminating the scene with laser light and measuring the returned signal.

Frequency Modulated Continuous Wave (FMCW) is an example of a coherent detection method can be used for LIDAR applications. The FMCW technique is capable of determining distance and/or radial velocity between an object and the LIDAR system with a single measurement. Additionally, FMCW techniques have reduced sensitivity to ambient light and light from other LIDAR systems.

Since FMCW is a coherent detection technique, a light source with a narrow linewidth is needed to achieve acceptable signal-to-noise ratios in the measurement of the returned signal at the distance that is required for most LIDAR applications. Narrow linewidth emission is typically achieved in a laser diode using Distributed FeedBack (DFB) laser with an ultra long cavity or an External Cavity Laser (ECL). However, fabrication costs and/or complexity make the use of these lasers on LIDAR chips impractical. Discrete Mode Fabry-Perot (DMFP) lasers are practical lasers for use on LIDAR chips. While these lasers can provide linewidths in the range of ~100 kHz, they cannot provide the 1-10 kHz linewidths that are desired for most LIDAR applications. As a result, there is a need for a light source that is suitable for use in LIDAR systems.

SUMMARY

A laser system includes a resonant laser cavity configured to output a laser signal. The system also includes a utility waveguide configured to receive the laser signal from the laser cavity. The utility waveguide includes a perturbation region that is external to the laser cavity and receives the laser signal from the laser cavity and outputs a laser beam. The perturbation region includes one or more perturbation structures that each causes one or more perturbation(s) in the index of refraction of the utility waveguide. The perturbation structures are selected to provide optical feedback to the resonant laser cavity such that a power versus wavelength distribution in the laser beam is different from the power versus wavelength distribution that would be in the laser signal in the absence of the perturbation structures. The optical feedback can be a result of reflection of light from the perturbation structures back into the laser cavity.

A LIDAR system includes a resonant laser cavity configured to output a laser signal. The system also includes a utility waveguide configured to receive the laser signal from the laser cavity. The utility waveguide includes a perturbation region that is external to the laser cavity and receives the laser signal from the laser cavity and outputs an outgoing LIDAR signal. The perturbation region includes one or more perturbation structures that each causes one or more perturbation(s) in the index of refraction of the utility waveguide. The perturbation structures are selected to provide optical feedback to the resonant laser cavity such that a power versus wavelength distribution in the laser signal is different from the power versus wavelength distribution that would be in the laser signal in the absence of the perturbation structures.

BRIEF DESCRIPTION OF THE FIGURES

FIG. 9A through FIG. 9G illustrates an example of suitable light source for use with the LIDAR system. FIG. 9A is a topview of the light source.

FIG. 9B is a cross section of the light source shown in FIG. 9A taken along the line labeled B.

FIG. 9C is a cross section of the light source taken along a line extending between the brackets labeled C in FIG. 9A.

FIG. 9D is a cross section of the light source taken along a line extending between the brackets labeled D in FIG. 9A.

FIG. 9E is a cross section of the light source of FIG. 9A taken along a line extending between the brackets labeled E in FIG. 9A.

FIG. 9F is a perspective view showing a closer view of a perturbation region in the utility waveguide shown FIG. 9A.

FIG. 9G is a graph comparing mirror loss caused by a perturbation with a gain curve for a laser.

DESCRIPTION

A laser system includes a light source with a laser cavity that outputs a laser signal. The light source also includes a utility waveguide that receives the laser signal from the laser cavity. The utility waveguide includes perturbation region that receives the laser signal and outputs a laser beam. The perturbation region includes one or more perturbation structures that each causes one or more perturbation(s) in the effective refractive index of the utility waveguide. The perturbation structures are external to the laser cavity but provide optical feedback to the resonant cavity that affects the output of the laser signal. For instance, the perturbation structures can provide a reflection of the laser signal such that output of the laser signal is different from what the laser signal would be in the absence of the perturbation structures. For instance, the perturbation structures can be selected so as to cause the laser cavity to lase a single mode and accordingly to output a single mode that serves as the laser signal and laser beam. For instance, the perturbation structures can be selected to enhance the mode of the laser cavity that serves as the laser signal while suppressing the other modes (side modes).

The laser cavity can be a Fabry-Perot laser cavity. As a result, the external perturbations can effectively convert a Fabry-Perot laser cavity to a light source that outputs a single mode, narrow-linewidth light signal. Since Fabry-Perot laser cavities are readily available and affordable, the laser system is practical for manufacturing.

In prior laser systems, the linewidth can be decreased by increasing the length of the laser cavity. However, in the current laser system, the linewidth is a function of the length of the laser cavity and the distance to the perturbation region. For instance, the linewidth can be decreased by increasing the distance between the laser cavity and the perturbation region. As a result, narrow and ultra-narrow linewidths can be achieved without increasing the length of the laser cavity to impractical sizes.

In some instances, the laser system is a LIDAR system. The signal-to-noise ratio for LIDAR systems that operate at large distances increases as the linewidth decreases. As a result, the light source improves the performance of LIDAR systems while being both practical and affordable.

Figure 1:
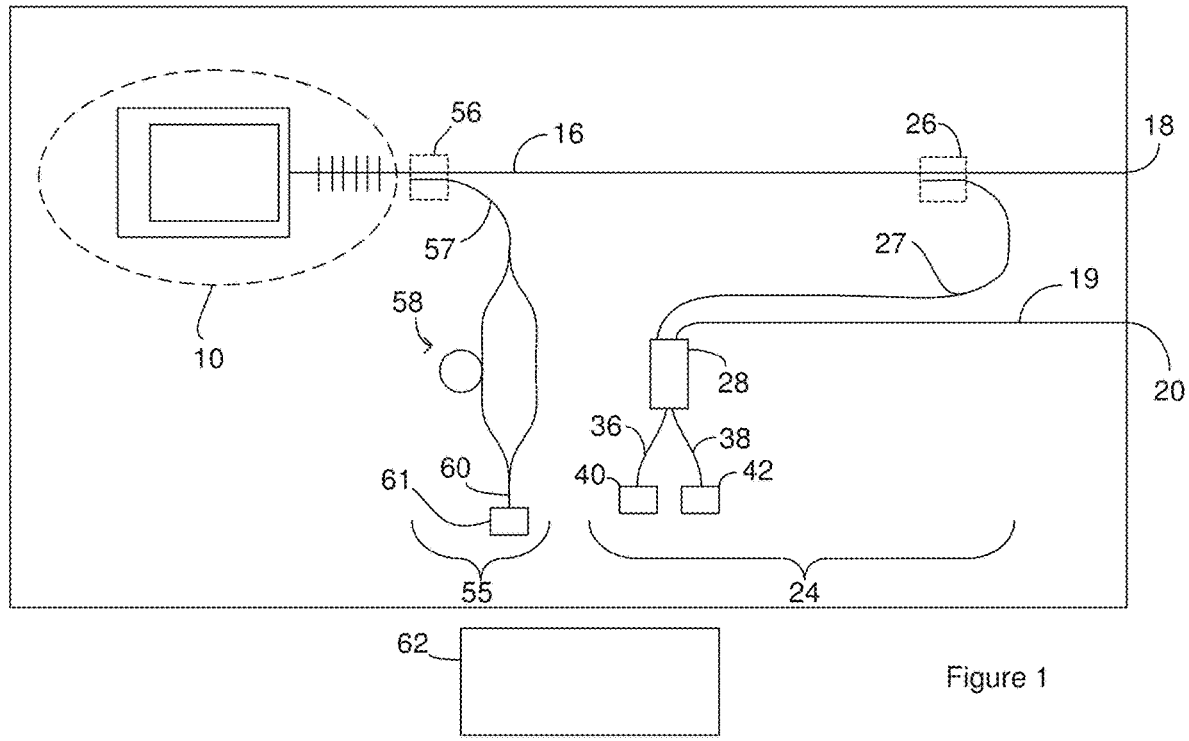
FIG. 1 is a top view of a LIDAR chip that is suitable for use with a LIDAR adapter.

FIG. 1 is a topview of an example of a LIDAR chip that includes a light source 10. The output of the light source 10 is received by a utility waveguide 16 and serves as an outgoing LIDAR signal on the utility waveguide 16. The utility waveguide 16 terminates at a facet 18 and carries the outgoing LIDAR signal to the facet 18. The facet 18 can be positioned such that the outgoing LIDAR signal traveling through the facet 18 exits the chip and serves as a LIDAR output signal. For instance, the facet 18 can be positioned at an edge of the chip so the outgoing LIDAR signal traveling through the facet 18 exits the chip and serves as a LIDAR output signal.

The LIDAR output signal travels away from the chip and may be reflected by objects in the path of the LIDAR output signal. The reflected signal travels away from the objects. When the LIDAR output signal is reflected, at least a portion of the light from the reflected signal is returned to an input waveguide 19 on the LIDAR chip as a first LIDAR input signal. The input waveguide 19 includes a facet 20 through which the first LIDAR input signal can enter the input waveguide 19. The portion of the first LIDAR input signal that enters the input waveguide 19 can be considered an incoming LIDAR signal and acts as a comparative signal carried by the input waveguide 19. The input waveguide 19 carries the comparative signal to a light-combining component 28.

The chip includes a data branch 24 where the optical signals that are processed for LIDAR data are generated. The data branch includes a splitter 26 that moves a portion of the outgoing LIDAR signal from the utility waveguide 16 into the data branch. For instance, the splitter 26 moves a portion of the outgoing LIDAR signal from the utility waveguide 16 onto a reference waveguide 27 as a reference signal. The reference waveguide 27 carries the reference signal to the light-combining component 28. The illustrated splitter 26 is an optical coupler that operates as a result of positioning the utility waveguide 16 sufficiently close to the reference waveguide 27 that light from the utility waveguide 16 is coupled into the reference waveguide 27; however, other signal tapping components can be used to move a portion of the of the light signals from the utility waveguide 16 onto the reference waveguide 27. Examples of suitable splitters 26 include, but are not limited to, y-junctions, optical couplers, and multi-mode interference couplers (MMIs).

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and the first LIDAR input signal. In contrast, the comparative signal includes light from the first LIDAR input signal. For instance, the comparative signal can serve as a sample of the first LIDAR input signal. Accordingly, the comparative signal includes or consists of light that has been reflected by an object located off the chip in a sample region in a field of view while the reference signal does not include light that has been reflected by the object. When the chip and the reflecting object are moving relative to one another, the comparative signal and the reference signal may have different frequencies at least partially due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light combining component 28, the first light sensor 40 and the second light sensor 42 can be connected as a balanced photodetector that outputs an electrical data signal. For instance, the light combining component 28, the first light sensor 40 and the second light sensor 42 can be connected such that the DC component of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MMI) device such as a 2×2 MMI device. Other suitable light-combining components 28 include, but are not limited to, adiabatic splitters, and directional coupler. The functions of the illustrated light-combining component 28 can be performed by more than one optical component.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zhender interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency of the outgoing LIDAR signal. For instance, a Mach-Zhender interferometer will output a sinusoidal control light signal with a fringe pattern. Changes to the frequency of the outgoing LIDAR signal will cause changes to the frequency of the control light signal. Accordingly, the frequency of the electrical control signal output from the control light sensor 61 is a function of the frequency of the outgoing LIDAR signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the first light sensor 40, the second light sensor 42, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operates the light source 10 such that the light source 10 outputs the outgoing LIDAR signal. The electronics 62 then operate the LIDAR chip through a series of cycles where LIDAR data is generated for each (radial distance and/or radial velocity between the LIDAR system and a reflecting object) cycle. In some instances, the LIDAR system includes one or more mechanisms for steering the direction that the LIDAR output signal travels away from the LIDAR system. The electronics can operate the one or more mechanisms so as to direct the LIDAR output signal to different sample regions in a field of view. The sample regions can each be associated with one of the cycles and/or each cycle can be associated with one of the sample regions. As a result, each LIDAR data result can be associated with one of the sample regions in the field of view. Different sample regions can overlap one another and/or be separated from one another.

Each cycle includes one or more data periods. During each data period, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes a first data period and a second data period. During the first data period, the electronics 62 can increase the frequency of the LIDAR output signal and during a second sample the electronics 62 can decrease the frequency of the LIDAR output signal. In some instances, the change in frequency of the LIDAR output signal is linear. In one example, the laser cavity is operated so as to output an outgoing LIDAR signal (and accordingly a LIDAR output signal) with a wavelength of 1550 nm. During the first data period, the electronics 62 can linearly increase the frequency of the outgoing LIDAR signal (and accordingly a LIDAR output signal) such that the wavelength decreases from 1550 nm to 1459.98 nm followed by a second data period where the frequency of the outgoing LIDAR signal is linearly decreased from 1459.98 nm to 1550 nm.

When the outgoing LIDAR signal frequency is increased during the first data period, the LIDAR output signal travels away from the LIDAR chip and light from the LIDAR output signal can be reflected by an object positioned in a sample region of a field of view. At least a portion of the reflected light is then returned to the chip in a first LIDAR input signal. As noted above, a portion of the first LIDAR input signal becomes the comparative signal. During the time that the LIDAR output signal and the first LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the first LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second data period, the comparative signal enters the light-combining component with a higher frequency than the reference signal concurrently entering the light-combining component and the difference between the frequency of the comparative signal and the frequency of the reference signal during the second data period is also function of the distance between the LIDAR system and the reflecting object.

In some instances, the difference between the frequency of the comparative signal and the frequency of the reference signal can also be a function of the Doppler effect because relative movement of the LIDAR system and reflecting object can also affect the frequency of the comparative signal. For instance, when the LIDAR system is moving toward or away from the reflecting object and/or the reflecting object is moving toward or away from the LIDAR system, the Doppler effect can affect the frequency of the comparative signal. Since the frequency of the comparative signal is a function of the radial velocity between the reflecting object and the LIDAR system, the difference between the frequency of the comparative signal and the frequency of the reference signal is also a function of the radial velocity between the reflecting object and the LIDAR system. Accordingly, the difference between the frequency of the comparative signal and the frequency of the reference signal is a function of the distance and/or radial velocity between the LIDAR system and the reflecting object.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance and/or radial velocity between the LIDAR system and the reflecting object.

As noted above, the beat frequency is a function of two unknowns; the distance between the LIDAR system and the reflecting object and the relative velocity of the chip and the reflecting object (i.e., the contribution of the Doppler effect). The change in the frequency difference between the comparative signal and the reference signal ($\Delta f$) is given by $\Delta f = 2\Delta v f/c$ where base f is the frequency of the LIDAR output signal and accordingly the reference signal, $\Delta v$ is the radial velocity between the LIDAR system and the reflecting object and c is the speed of light in air. The use of multiple different data periods permits the electronics 62 to resolve the two unknowns. For instance, the beat frequency determined for the first data period is related to the unknown distance and Doppler contribution and the beat frequency determined for the second data period is also related to the unknown distance and Doppler contribution. The availability of the two relationships allows the electronics 62 to resolve the two unknowns. Accordingly, the distance between the LIDAR system and the reflecting object can be determined without influence from the Doppler effect. Further, in some instances, the electronics 62 use this distance in combination with the Doppler effect to determine the radial velocity between the LIDAR chip and the reflecting object.

In instances where the radial velocity between the LIDAR chip and the reflecting object is zero or very small, the contribution of the Doppler effect to the beat frequency is essentially zero. In these instances, the Doppler effect does not make a substantial contribution to the beat frequency and the electronics 62 can use only the first data period to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during a data period, the electronics 62 can have a range of suitable values for the electrical control signal magnitude as a function of time. At multiple different times during a data period, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

Figure 2:
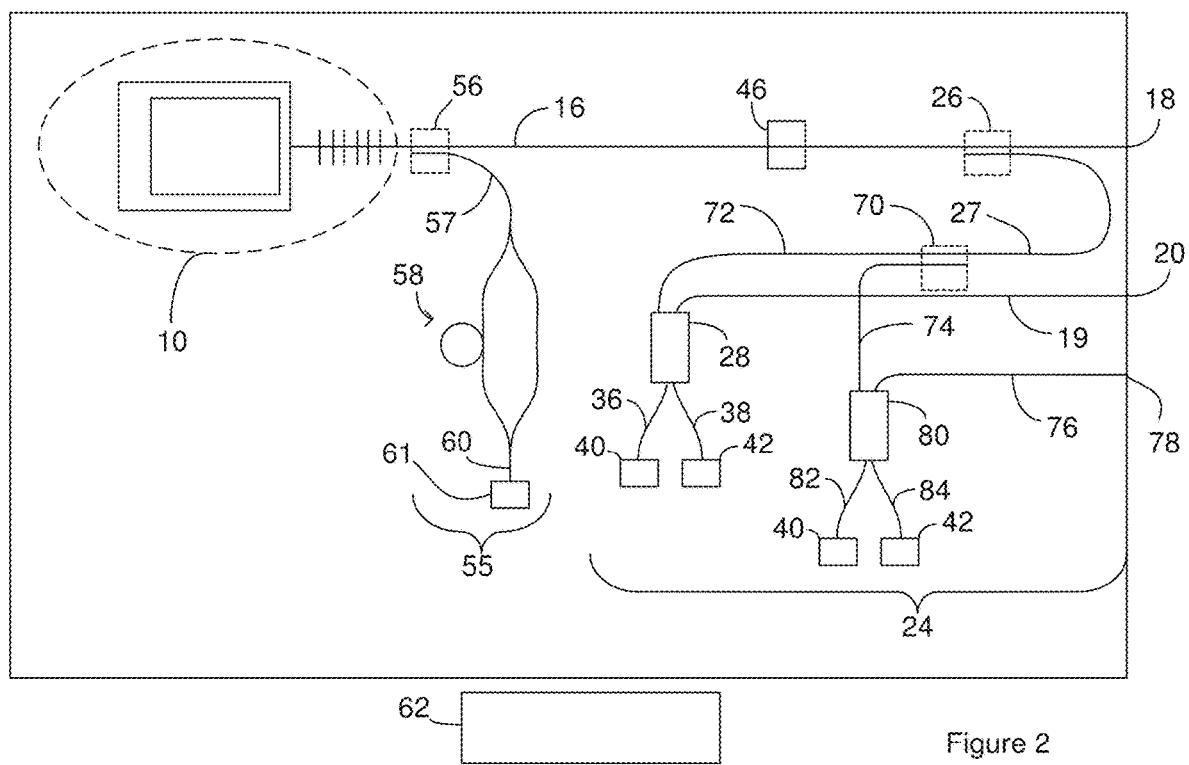
FIG. 2 is a top view of a LIDAR chip configured to receive multiple different LIDAR input signals and is suitable for use with a LIDAR adapter.

The LIDAR chip of FIG. 1 can be modified to receive multiple first LIDAR input signals. For instance, FIG. 2 illustrates the LIDAR chip of FIG. 1 modified to receive two first LIDAR input signals. A splitter 70 is configured to move a portion of the reference signal carried on the reference waveguide 27 onto a first reference waveguide 72 and another portion of the reference signal onto a second reference waveguide 74. Accordingly, the first reference waveguide 72 carries a first reference signal and the second reference waveguide 74 carries a second reference signal. The first reference signal is carried to the light-combining component 28 and processed by the light-combining component 28 as described in the context of FIG. 1. Examples of suitable splitters 70 include, but are not limited to, y-junctions, optical couplers, and multi-mode interference couplers (MMIs).

As described above, a LIDAR output signal that travels away from the chip may be reflected by one or more objects in the path of the LIDAR output signal. The reflected signal travels away from the objects. When the LIDAR output signal travel is reflected, at least a portion of the reflected signal is returned to a second input waveguide 76 on the LIDAR chip as a second LIDAR input signal. The second input waveguide 76 includes a facet 78 through which the first LIDAR input signal can enter the second input waveguide 76. The portion of the second LIDAR input signal that enters the input waveguide 19 acts as a second comparative signal carried by the second input waveguide 76.

The second input waveguide 76 carries the second comparative signal to a second light-combining component 80. Additionally, the second reference waveguide 74 carries the second reference signal to the second light-combining component 80. The second light-combining component 80 combines the second comparative signal and the second reference signal into a second composite signal. The second reference signal includes light from the outgoing LIDAR signal. For instance, the second reference signal can serve as a sample of the outgoing LIDAR signal. The second reference signal can exclude light from the LIDAR output signal and the second LIDAR input signal. In contrast, the second comparative signal includes light from the second LIDAR input signal. For instance, the second comparative signal can serve as a sample of the second LIDAR input signal. Accordingly, the second comparative signal has been reflected by an object located outside of the LIDAR system while the second reference signal has not been reflected. When the chip and the reflecting object are moving relative to one another, the second comparative signal and the second reference signal may have different frequencies at least partially due to the Doppler effect. As a result, beating occurs between the second comparative signal and the second reference signal.

The second light-combining component 80 also splits the resulting second composite signal onto a first detector waveguide 82 and a second detector waveguide 84. The first detector waveguide 82 carries a first portion of the second composite signal to a first light sensor 40 that converts the first portion of the second composite signal to a first electrical signal. The second detector waveguide 84 carries a second portion of the second composite sample signal to a second light sensor 42 that converts the second portion of the composite sample signal to a second electrical signal. Examples of suitable light sensors include germanium photodiodes (PDs), and avalanche photodiodes (APDs).

The second light combining component 80, the associated first light sensor 40 and the associated second light sensor 42 can be connected as a balanced photodetector that outputs a second electrical data signal. For instance, the second light combining component 80, the associated first light sensor 40 and the associated second light sensor 42 can be connected such that the DC component of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable second light-combining component 80 is a Multi-Mode Interference (MMI) device such as a 2×2 MMI device. Other suitable second light-combining components 80 include, but are not limited to, adiabatic splitters, and directional coupler. The functions of the illustrated second light-combining component 80 can be performed by more than one optical component.

The electronics 62 can operate one or more components on the chip to generate LIDAR outputs signals over multiple different cycles as described above. Additionally, the electronics 62 can process the second electrical signal as described above in the context of FIG. 1. Accordingly, the electronics can generate second LIDAR data results from the second composite signals and/or LIDAR data results from the composite signals. As a result, the second LIDAR data results and/or the LIDAR data results can be generated from the same LIDAR output signal.

Figure 3:
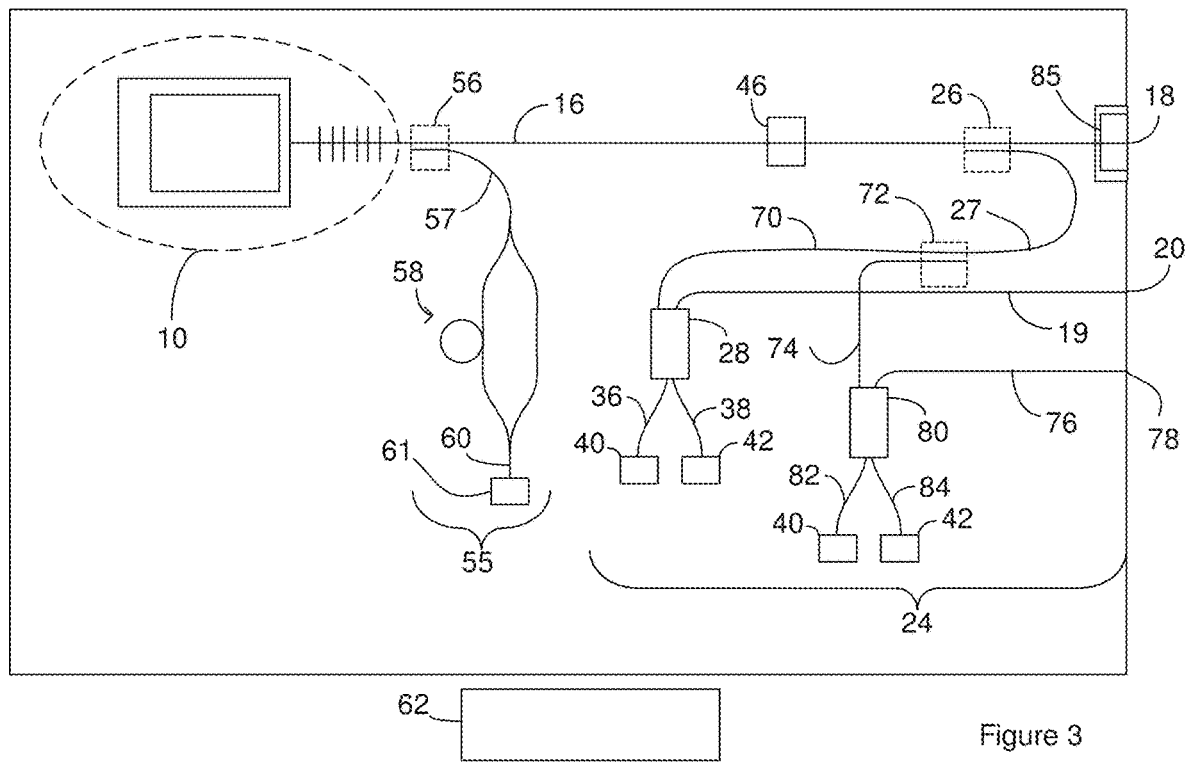
FIG. 3 is a top view of a LIDAR chip configured to receive multiple different LIDAR input signals and is suitable for use with a LIDAR adapter.

The LIDAR chips can be modified to include other components. For instance, FIG. 3 illustrates the LIDAR chip of FIG. 2 modified to include an amplifier 85 positioned at an edge of the LIDAR chip such that the utility waveguide 16 terminates at a facet of the amplifier 85. The amplifier 85 can be operated by the electronics 62. As a result, the electronics 62 can control the power of the LIDAR output signal. Suitable amplifiers include, but are not limited to, Erbium-doped fiber amplifiers (EDFAs), Erbium-doped waveguide amplifiers (EDWAs), and Semiconductor Optical Amplifiers (SOAs).

Figure 4:
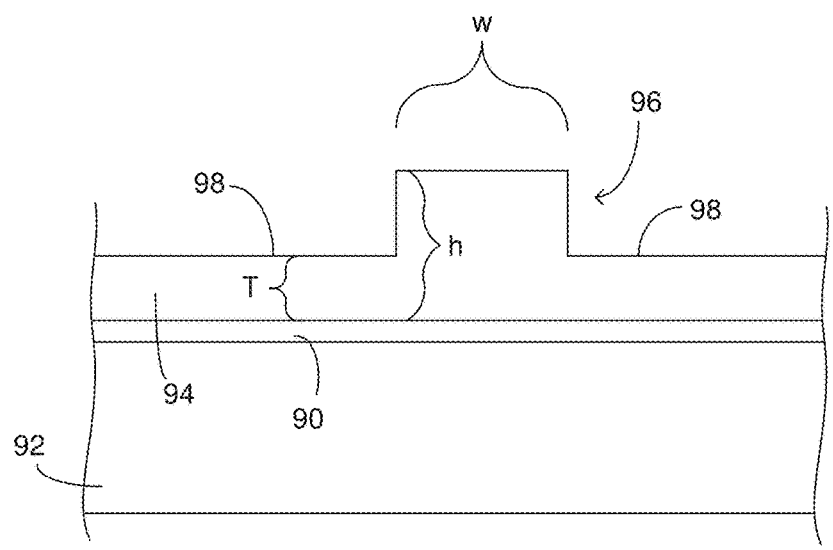
FIG. 4 is a cross-section of a LIDAR chip according to FIG. 1 through 3 constructed from a silicon-on-insulator wafer.

Suitable platforms for the LIDAR chips include, but are not limited to, silica, indium phosphide, and silicon-on-insulator wafers. FIG. 4 is a cross-section of portion of a chip constructed from a silicon-on-insulator wafer. A silicon-on-insulator (SOI) wafer includes a buried layer 90 between a substrate 92 and a light-transmitting medium 94. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 through FIG. 3 can be positioned on or over the top and/or lateral sides of the substrate.

The portion of the chip illustrated in FIG. 4 includes a waveguide construction that is suitable for use with chips constructed from silicon-on-insulator wafers. A ridge 96 of the light-transmitting medium extends away from slab regions 98 of the light-transmitting medium. The light signals are constrained between the top of the ridge and the buried oxide layer.

The dimensions of the ridge waveguide are labeled in FIG. 4. For instance, the ridge has a width labeled w and a height labeled h. A thickness of the slab regions is labeled T. For LIDAR applications, these dimensions can be more important than other dimensions because of the need to use higher levels of optical power than are used in other applications. The ridge width (labeled w) is greater than 1 µm and less than 4 µm, the ridge height (labeled h) is greater than 1 µm and less than 4 µm, the slab region thickness is greater than 0.5 µm and less than 3 µm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 µm and less than 0.5 µm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 4 is suitable for all or a portion of the waveguides on LIDAR chips constructed according to FIG. 1 through FIG. 3.

The attenuators can be a component that is separate from the chip and then attached to the chip. For instance, the attenuator can be included on an attenuator chip that is attached to the chip in a flip-chip arrangement. The use of attenuator chips is suitable for all or a portion of the attenuators selected from the group consisting of the data attenuator and the control attenuator.

As an alternative to including an attenuator on a separate component, all or a portion of the attenuators can be integrated with the chip. For instance, examples of attenuators that are interfaced with ridge waveguides on a chip constructed from a silicon-on-insulator wafer can be found in U.S. Pat. No. 5,908,305, issued on Jun. 1, 1999; each of which is incorporated herein in its entirety. The use of attenuators that are integrated with the chip are suitable for all or a portion of the light sensors selected from the group consisting of the data attenuator and the control attenuator.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu City, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 18 located at an edge of the chip and the light sensor can be attached to the edge of the chip over the facet 18 such that the light sensor receives light that passes through the facet 18. The use of light sensors that are a separate component from the chip is suitable for all or a portion of the light sensors selected from the group consisting of the first light sensor 40, the second light sensor 42, the sampling light sensor 54, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10, 2012; U.S. Pat. No. 8,242,432, issued Aug. 14, 2012; and U.S. Pat. No. 6,108,472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 54, and the control light sensor 61.

Amplifiers that are interfaced with waveguides on a chip can be a component that is separate from the chip and then attached to the chip. For instance, the amplifier can be a Semiconductor Optical Amplifier (SOA) or Booster Optical Amplifier (BOA) as a discrete component. Examples of discrete component amplifiers include, but are not limited to, BOA1007C manufactured by Thorlabs located in Newton, N.J., USA. These amplifiers can be centrally located on the LIDAR chip. Alternately, all or a portion the waveguides that terminate at an amplifier 18 located at an edge of the LIDAR chip such that the amplifier receives light that passes through the amplifier. As an alternative to an amplifier that is a discrete component, all or a portion of the amplifiers can be integrated with the LIDAR chip. For instance, examples of amplifiers that are interfaced with ridge waveguides on a chip constructed from a silicon-on-insulator wafer can be found in U.S. patent application Ser. No. 62/814,844, U.S. Pat. Nos. 9,025,241, and 7,542,641 each of which is incorporated herein in its entirety.

Construction of optical gratings that are integrated with a variety of optical device platforms are available. For instance, a Bragg grating can be formed in a ridge waveguides by forming grooves in the top of the ridge and/or in the later sides of the ridge.

Suitable electronics can include, but are not limited to, a controller that includes or consists of analog electrical circuits, digital electrical circuits, processors, microprocessors, digital signal processors (DSPs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

Although the light source is shown as being positioned on the chip, all or a portion of the light source can be located off the chip. For instance, the utility waveguide 16 can terminate at a second facet through which the outgoing LIDAR signal can enter the utility waveguide 16 from a light source located off the chip.

The LIDAR chips can be used in conjunction with a LIDAR adapter. In some instances, the LIDAR adapter can be physically optically positioned between the LIDAR chip and the one or more reflecting objects and/or the field of view in that an optical path that the first LIDAR input signal(s) and/or the LIDAR output signal travels from the LIDAR chip to the field of view passes through the LIDAR adapter. Additionally, the LIDAR adapter can be configured to operate on the first LIDAR input signal and the LIDAR output signal such that the first LIDAR input signal and the LIDAR output signal travel on different optical pathways between the LIDAR adapter and the LIDAR chip but on the same optical pathway between the LIDAR adapter and a reflecting object in the field of view.

Figure 5:
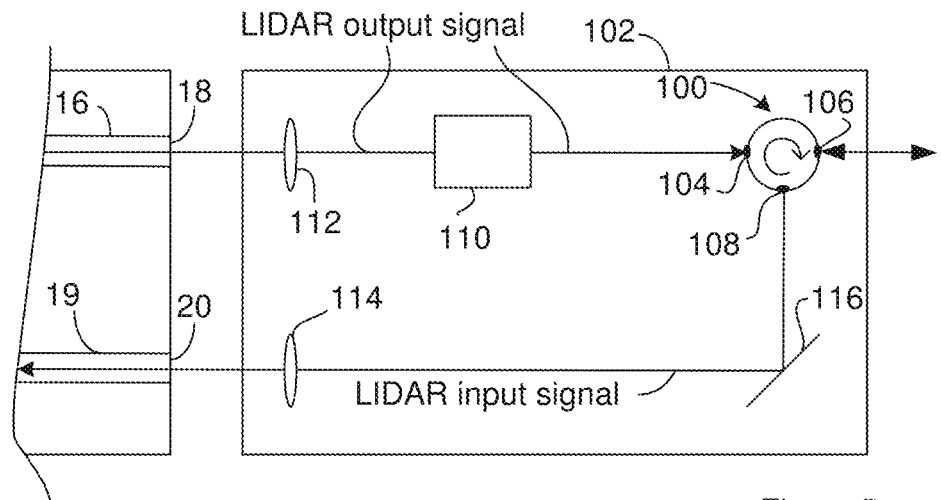
FIG. 5 is a top view of a LIDAR adapter.

An example of a LIDAR adapter that is suitable for use with the LIDAR chip of FIG. 1 is illustrated in FIG. 5. The LIDAR adapter includes multiple components positioned on a base. For instance, the LIDAR adapter includes a circulator 100 positioned on a base 102. The illustrated optical circulator 100 includes three ports and is configured such that light entering one port exits from the next port. For instance, the illustrated optical circulator includes a first port 104, a second port 106, and a third port 108. The LIDAR output signal enters the first port 104 from the utility waveguide 16 of the LIDAR chip and exits from the second port 106. The LIDAR adapter can be configured such that the output of the LIDAR output signal from the second port 106 can also serve as the output of the LIDAR output signal from the LIDAR adapter. As a result, the LIDAR output signal can be output from the LIDAR adapter such that the LIDAR output signal is traveling toward a sample region in the field of view.

The LIDAR output signal output from the LIDAR adapter includes, consists of, or consists essentially of light from the LIDAR output signal received from the LIDAR chip. Accordingly, the LIDAR output signal output from the LIDAR adapter may be the same or substantially the same as the LIDAR output signal received from the LIDAR chip. However, there may be differences between the LIDAR output signal output from the LIDAR adapter and the LIDAR output signal received from the LIDAR chip. For instance, the LIDAR output signal can experience optical loss as it travels through the LIDAR adapter.

When an object in the sample region reflects the LIDAR output signal, at least a portion of the reflected light travels back to the circulator 100 as a LIDAR return signal. The LIDAR return signal enters the circulator 100 through the second port 106. FIG. 5 illustrates the LIDAR output signal and the LIDAR return signal traveling between the LIDAR adapter and the sample region along the same optical path.

The LIDAR return signal exits the circulator 100 through the third port 108 and is directed to the input waveguide 19 on the LIDAR chip. Accordingly, light from the LIDAR return signal can serve as the first LIDAR input signal and the first LIDAR input signal includes or consists of light from the LIDAR return signal. Accordingly, the LIDAR output signal and the first LIDAR input signal travel between the LIDAR adapter and the LIDAR chip along different optical paths.

As is evident from FIG. 5, the LIDAR adapter can include optical components in addition to the circulator 100. For instance, the LIDAR adapter can include components for directing and controlling the optical path of the LIDAR output signal and the LIDAR return signal. As an example, the adapter of FIG. 5 includes an optional amplifier 110 positioned so as to receive and amplify the LIDAR output signal before the LIDAR output signal enters the circulator 100. The amplifier 110 can be operated by the electronics 62 allowing the electronics 62 to control the power of the LIDAR output signal.

FIG. 5 also illustrates the LIDAR adapter including an optional first lens 112 and an optional second lens 114. The first lens 112 can be configured to couple the LIDAR output signal to a desired location. In some instances, the first lens 112 is configured to focus or collimate the LIDAR output signal at a desired location. In one example, the first lens 112 is configured to couple the LIDAR output signal on the first port 104 when the LIDAR adapter does not include an amplifier 110. As another example, when the LIDAR adapter includes an amplifier 110, the first lens 112 can be configured to couple the LIDAR output signal on the entry port to the amplifier 110. The second lens 114 can be configured to couple the LIDAR output signal at a desired location. In some instances, the second lens 114 is configured to focus or collimate the LIDAR output signal at a desired location. For instance, the second lens 114 can be configured to couple the LIDAR output signal the on the facet 20 of the input waveguide 19.

The LIDAR adapter can also include one or more direction changing components such as mirrors. FIG. 5 illustrates the LIDAR adapter including a mirror as a direction-changing component 116 that redirects the LIDAR return signal from the circulator 100 to the facet 20 of the input waveguide 19.

The LIDAR chips include one or more waveguides that constrains the optical path of one or more light signals. While the LIDAR adapter can include waveguides, the optical path that the LIDAR return signal and the LIDAR output signal travel between components on the LIDAR adapter and/or between the LIDAR chip and a component on the LIDAR adapter can be free space. For instance, the LIDAR return signal and/or the LIDAR output signal can travel through the atmosphere in which the LIDAR chip, the LIDAR adapter, and/or the base 102 is positioned when traveling between the different components on the LIDAR adapter and/or between a component on the LIDAR adapter and the LIDAR chip. As a result, optical components such as lenses and direction changing components can be employed to control the characteristics of the optical path traveled by the LIDAR return signal and the LIDAR output signal on, to, and from the LIDAR adapter.

Suitable bases 102 for the LIDAR adapter include, but are not limited to, substrates, platforms, and plates. Suitable substrates include, but are not limited to, glass, silicon, and ceramics. The components can be discrete components that are attached to the substrate. Suitable techniques for attaching discrete components to the base 102 include, but are not limited to, epoxy, solder, and mechanical clamping. In one example, one or more of the components are integrated components and the remaining components are discrete components. In another example, the LIDAR adapter includes one or more integrated amplifiers and the remaining components are discrete components.

The LIDAR system can be configured to compensate for polarization. Light from a laser source is typically linearly polarized and hence the LIDAR output signal is also typically linearly polarized. Reflection from an object may change the angle of polarization of the returned light. Accordingly, the LIDAR return signal can include light of different linear polarization states. For instance, a first portion of a LIDAR return signal can include light of a first linear polarization state and a second portion of a LIDAR return signal can include light of a second linear polarization state. The intensity of the resulting composite signals is proportional to the square of the cosine of the angle between the comparative and reference signal polarization fields. If the angle is 90 degrees, the LIDAR data can be lost in the resulting composite signal. However, the LIDAR system can be modified to compensate for changes in polarization state of the LIDAR output signal.

Figure 6:
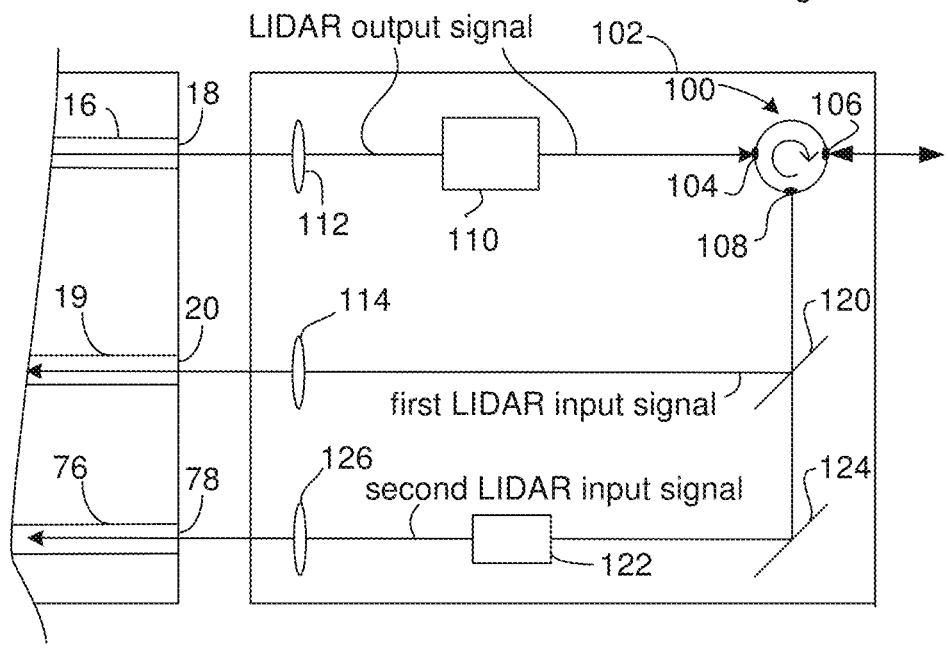
FIG. 6 is a top view of a LIDAR adapter for use with a LIDAR system providing polarization compensation.

FIG. 6 illustrates the LIDAR system of FIG. 5 modified such that the LIDAR adapter is suitable for use with the LIDAR chip of FIG. 2 or FIG. 3. The LIDAR adapter includes a beamsplitter 120 that receives the LIDAR return signal from the circulator 100. The beamsplitter 120 splits the LIDAR return signal into a first portion of the LIDAR return signal and a second portion of the LIDAR return signal. Suitable beamsplitters include, but are not limited to, Wollaston prisms, and MEMs-based beamsplitters.

The first portion of the LIDAR return signal is directed to the input waveguide 19 on the LIDAR chip and serves as the first LIDAR input signal described in the context of FIG. 1 through FIG. 5. The second portion of the LIDAR return signal is directed a polarization rotator 122. The polarization rotator 122 outputs a second LIDAR input signal that is directed to the second input waveguide 76 on the LIDAR chip and serves as the second LIDAR input signal described in the context of FIG. 2 through FIG. 5.

The beamsplitter 120 can be a polarizing beam splitter. One example of a polarizing beamsplitter is constructed such that the first portion of the LIDAR return signal has a first polarization state but does not have or does not substantially have a second polarization state and the second portion of the LIDAR return signal has a second polarization state but does not have or does not substantially have the first polarization state. The first polarization state and the second polarization state can be linear polarization states and the second polarization state is different from the first polarization state. For instance, the first polarization state can be TE and the second polarization state can be TM or the first polarization state can be TM and the second polarization state can be TE. In some instances, the laser source can be linearly polarized such that the LIDAR output signal has the first polarization state. Suitable beamsplitters include, but are not limited to, Wollaston prisms, and MEMs-based polarizing beamsplitters.

A polarization rotator can be configured to change the polarization state of the first portion of the LIDAR return signal and/or the second portion of the LIDAR return signal. For instance, the polarization rotator 122 shown in FIG. 6 can be configured to change the polarization state of the second portion of the LIDAR return signal from the second polarization state to the first polarization state. As a result, the second LIDAR input signal has the first polarization state but does not have or does not substantially have the second polarization state. Accordingly, the first LIDAR input signal and the second LIDAR input signal each have the same polarization state (the first polarization state in this discussion). Despite carrying light of the same polarization state, the first LIDAR input signal and the second LIDAR input signal are associated with different polarization states as a result of the use of the polarizing beamsplitter. For instance, the first LIDAR input signal carries the light reflected with the first polarization state and the second LIDAR input signal carries the light reflected with the second polarization state. As a result, the first LIDAR input signal is associated with the first polarization state and the second LIDAR input signal is associated with the second polarization state.

Since the first LIDAR input signal and the second LIDAR carry light of the same polarization state, the comparative signals that result from the first LIDAR input signal have the same polarization angle as the comparative signals that result from the second LIDAR input signal.

Suitable polarization rotators include, but are not limited to, rotation of polarization-maintaining fibers, Faraday rotators, half-wave plates, MEMs-based polarization rotators and integrated optical polarization rotators using asymmetric y-branches, Mach-Zehnder interferometers and multimode interference couplers.

Since the outgoing LIDAR signal is linearly polarized, the first reference signals can have the same linear polarization angle as the second reference signals. Additionally, the components on the LIDAR adapter can be selected such that the first reference signals, the second reference signals, the comparative signals and the second comparative signals each have the same polarization state. In the example disclosed in the context of FIG. 6, the first comparative signals, the second comparative signals, the first reference signals, and the second reference signals can each have light of the first polarization state.

As a result of the above configuration, the composite signals and the second composite signals each results from combining a reference signal and a comparative signal of the same polarization state and will accordingly provide the desired beating between the reference signal and the comparative signal. For instance, the composite signal results from combining a first reference signal and a first comparative signal of the first polarization state and excludes or substantially excludes light of the second polarization state or the composite signal results from combining a first reference signal and a first comparative signal of the second polarization state and excludes or substantially excludes light of the first polarization state. Similarly, the second composite signal includes a second reference signal and a second comparative signal of the same polarization state will accordingly provide the desired beating between the reference signal and the comparative signal. For instance, the second composite signal results from combining a second reference signal and a second comparative signal of the first polarization state and excludes or substantially excludes light of the second polarization state or the second composite signal results from combining a second reference signal and a second comparative signal of the second polarization state and excludes or substantially excludes light of the first polarization state.

The above configuration results in the LIDAR data for a single sample region in the field of view being generated from multiple different composite signals (i.e. first composite signals and the second composite signal) from the sample region. In some instances, determining the LIDAR data for the sample region includes the electronics combining the LIDAR data from different composite signals (i.e. the composite signals and the second composite signal). Combining the LIDAR data can include taking an average, median, or mode of the LIDAR data generated from the different composite signals. For instance, the electronics can average the distance between the LIDAR system and the reflecting object determined from the composite signal with the distance determined from the second composite signal and/or the electronics can average the radial velocity between the LIDAR system and the reflecting object determined from the composite signal with the radial velocity determined from the second composite signal.

In some instances, determining the LIDAR data for a sample region includes the electronics identifying one or more composite signals (i.e. the composite signal and/or the second composite signal) as the source of the LIDAR data that is most represents reality (the representative LIDAR data). The electronics can then use the LIDAR data from the identified composite signal as the representative LIDAR data to be used for additional processing. For instance, the electronics can identify the signal (composite signal or the second composite signal) with the larger amplitude as having the representative LIDAR data and can use the LIDAR data from the identified signal for further processing by the LIDAR system. In some instances, the electronics combine identifying the composite signal with the representative LIDAR data with combining LIDAR data from different LIDAR signals. For instance, the electronics can identify each of the composite signals with an amplitude above an amplitude threshold as having representative LIDAR data and when more than two composite signals are identified as having representative LIDAR data, the electronics can combine the LIDAR data from each of identified composite signals. When one composite signal is identified as having representative LIDAR data, the electronics can use the LIDAR data from that composite signal as the representative LIDAR data. When none of the composite signals is identified as having representative LIDAR data, the electronics can discard the LIDAR data for the sample region associated with those composite signals.

Although FIG. 6 is described in the context of components being arranged such that the first comparative signals, the second comparative signals, the first reference signals, and the second reference signals each have the first polarization state, other configurations of the components in FIG. 6 can arranged such that the composite signals result from combining a reference signal and a comparative signal of the same linear polarization state and the second composite signal results from combining a reference signal and a comparative signal of the same linear polarization state. For instance, the beamsplitter 120 can be constructed such that the second portion of the LIDAR return signal has the first polarization state and the first portion of the LIDAR return signal has the second polarization state, the polarization rotator receives the first portion of the LIDAR return signal, and the outgoing LIDAR signal can have the second polarization state. In this example, the first LIDAR input signal and the second LIDAR input signal each has the second polarization state.

The above system configurations result in the first portion of the LIDAR return signal and the second portion of the LIDAR return signal being directed into different composite signals. As a result, since the first portion of the LIDAR return signal and the second portion of the LIDAR return signal are each associated with a different polarization state but electronics can process each of the composite signals, the LIDAR system compensates for changes in the polarization state of the LIDAR output signal in response to reflection of the LIDAR output signal.

The LIDAR adapter of FIG. 6 can include additional optical components including passive optical components. For instance, the LIDAR adapter can include an optional third lens 126. The third lens 126 can be configured to couple the second LIDAR output signal at a desired location. In some instances, the third lens 126 focuses or collimates the second LIDAR output signal at a desired location. For instance, the third lens 126 can be configured to focus or collimate the second LIDAR output signal on the facet 78 of the second input waveguide 76. The LIDAR adapter also includes one or more direction changing components 124 such as mirrors and prisms. FIG. 6 illustrates the LIDAR adapter including a mirror as a direction changing component 124 that redirects the second portion of the LIDAR return signal from the circulator 100 to the facet 78 of the second input waveguide 76 and/or to the third lens 126.

Figure 7:
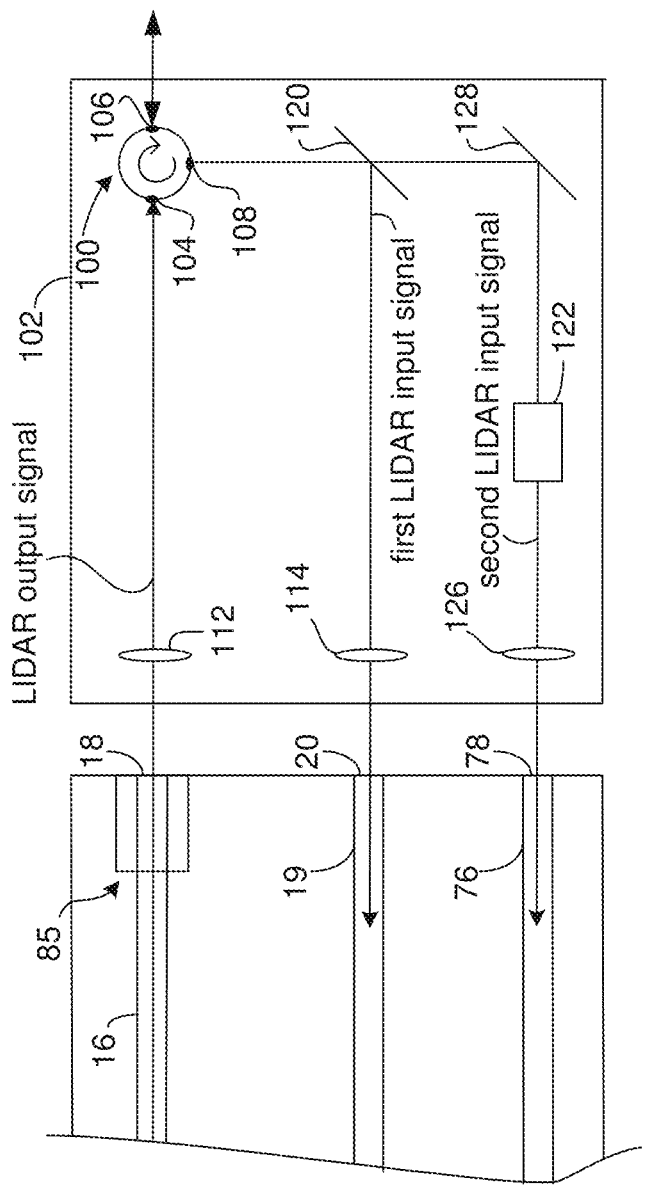
FIG. 7 is a top view of a LIDAR adapter that includes only passive optical components and is suitable for use with a LIDAR system providing polarization compensation.

FIG. 7 illustrates the LIDAR system of FIG. 6 modified such that the LIDAR adapter is suitable for use with the LIDAR chip of FIG. 2 or FIG. 3. The LIDAR output signal is not amplified on the LIDAR adapter of FIG. 7. FIG. 7 illustrates the LIDAR adapter used with the LIDAR chip of FIG. 3. Accordingly, an amplifier 85 operated by the electronics is positioned on the LIDAR chip rather than the LIDAR adapter. In this situation, the active components of the LIDAR system that are operated by the electronics and/or that provide electrical output to the electronics are positioned on the LIDAR chip while the passive components are located on the LIDAR adapter. Accordingly, an example of the LIDAR system has a LIDAR adapter that includes discrete passive components on a base and excludes integrated components on the base while the LIDAR chip includes a combination of discrete and integrated components or includes only integrated optical components.

Figure 8:
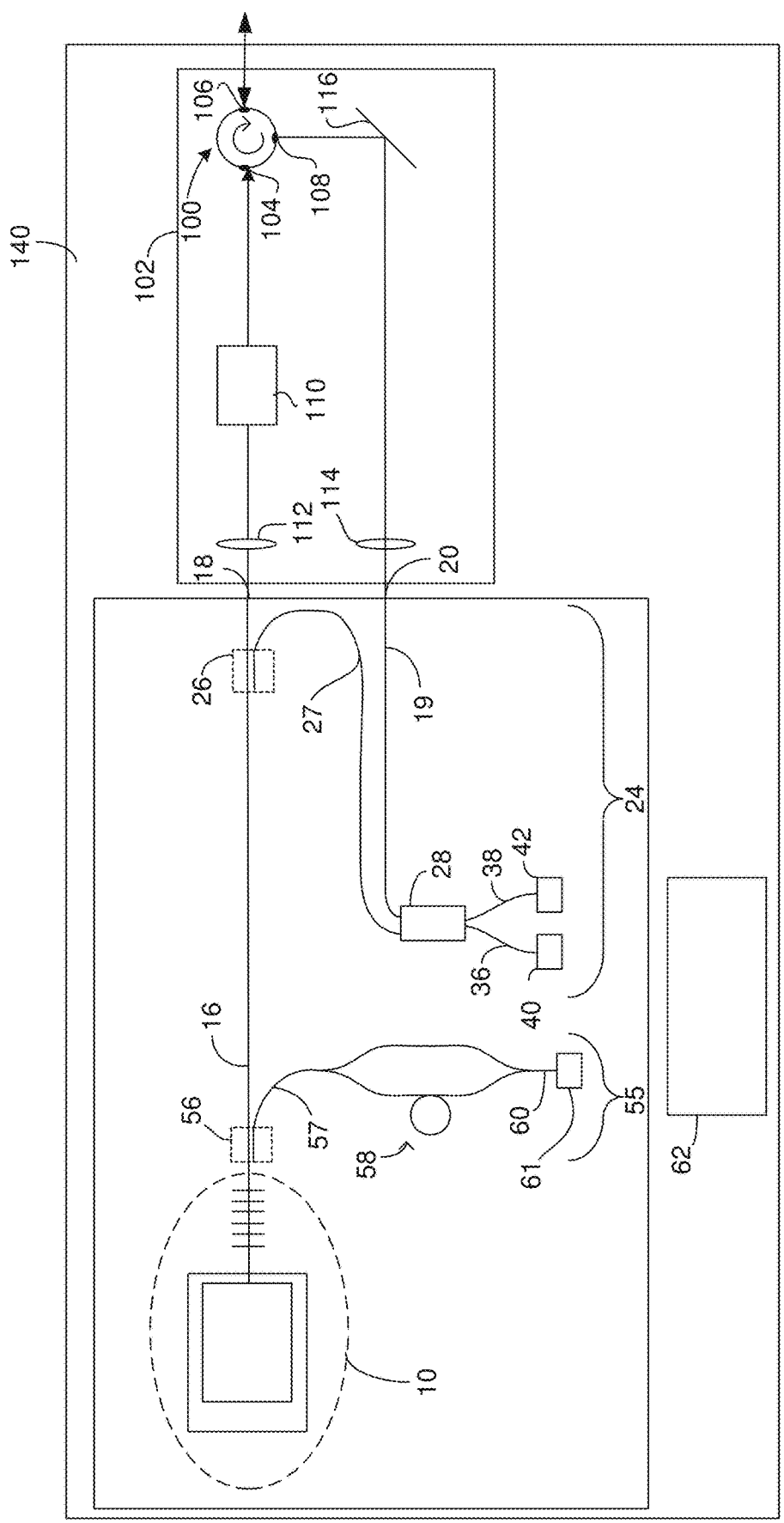
FIG. 8 is a topview of a LIDAR system that includes the LIDAR chip and electronics of FIG. 1 and the LIDAR adapter of FIG. 5 on a common support.

The LIDAR chip, electronics, and the LIDAR adapter can be positioned on a common mount. Suitable common mounts include, but are not limited to, glass plates, metal plates, silicon plates and ceramic plates. As an example, FIG. 8 is a topview of a LIDAR system that includes the LIDAR chip and electronics 62 of FIG. 1 and the LIDAR adapter of FIG. 5 on a common support 140. Although the electronics 62 are illustrated as being located on the common support, all or a portion of the electronics can be located off the common support. Suitable approaches for mounting the LIDAR chip, electronics, and/or the LIDAR adapter on the common support include, but are not limited to, epoxy, solder, and mechanical clamping.

Although the LIDAR system is shown as operating with a LIDAR chip that outputs a single LIDAR output signal, the LIDAR chip can be configured to output multiple LIDAR output signals. Multiple LIDAR adapters can be used with a single LIDAR chip and/or a LIDAR adapter can be scaled to receive multiple LIDAR output signals.

Figure 9D:
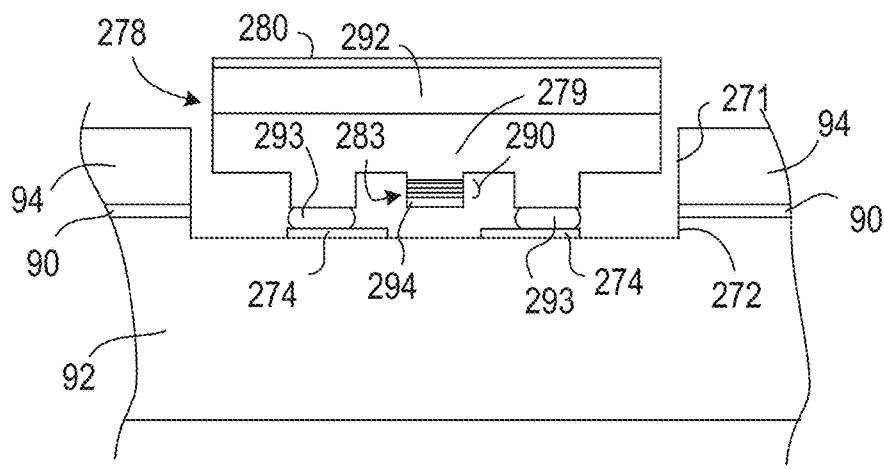
Figure 9E:
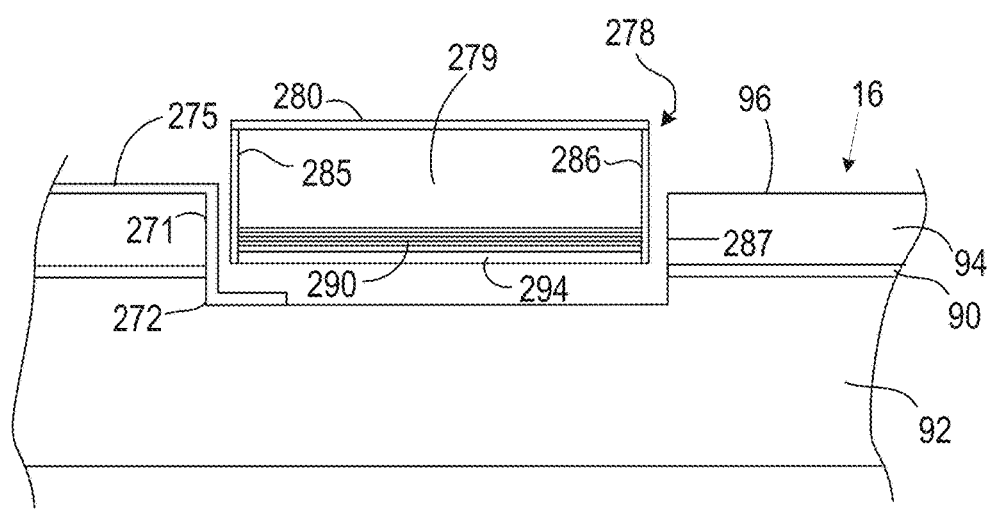
Figure 9F:
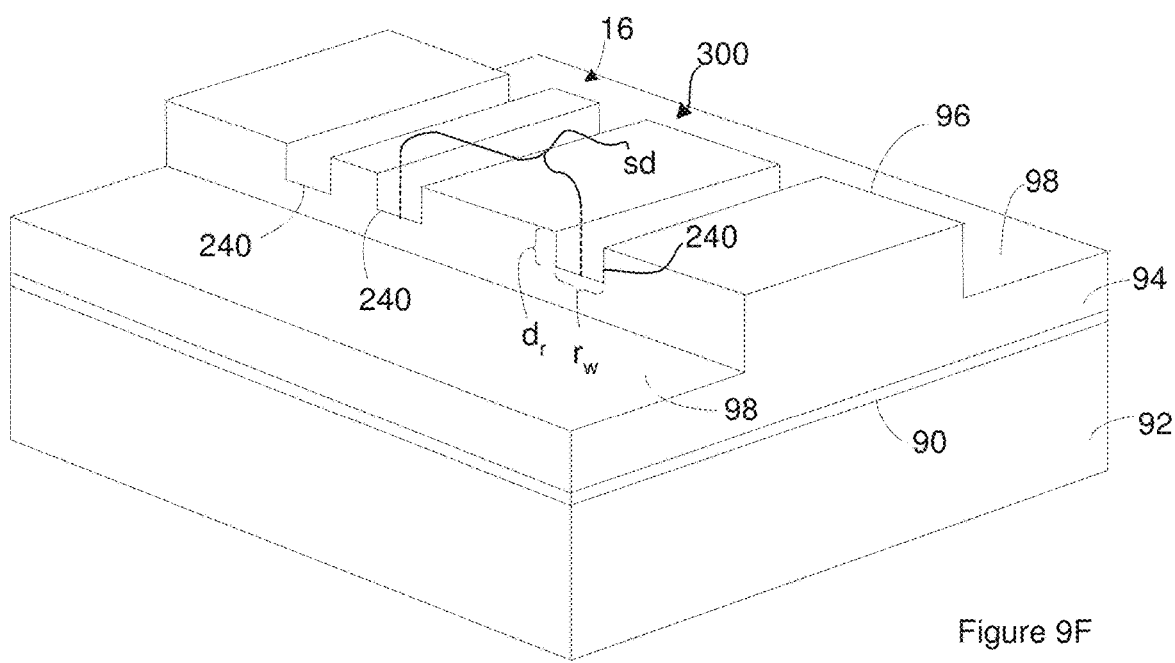

FIG. 9A through FIG. 9F illustrates an example of suitable light source for use with the LIDAR system. FIG. 9A is a topview of the light source. FIG. 9A includes dashed lines that each illustrates a component or a portion of a component that is located beneath other components that are illustrated by solid lines. The relationship between of the components illustrated by the dashed lines in FIG. 9A and the other components are also shown in FIG. 9B through FIG. 9F. FIG. 9B is a cross section of the light source shown in FIG. 9A taken along the line labeled B. The line labeled B extends through the utility waveguide 16 disclosed in FIG. 1. Accordingly, FIG. 9B includes a cross section of the utility waveguide 16. FIG. 9C is a cross section of the light source taken along a line extending between the brackets labeled C in FIG. 9A. FIG. 9C is a cross section of the light source taken along a line extending between the brackets labeled C in FIG. 9A. FIG. 9E is a cross section of the light source of FIG. 9A taken along a line extending between the brackets labeled D in FIG. 9A. FIG. 9F is a perspective view showing a closer view of a perturbation region of the utility waveguide 16 shown in of FIG. 9A. The light source is illustrated as being on a silicon-on-insulator platform although other platforms are possible.

A first recess 271 extends into or through the light-transmitting medium 94. In some instances where the first recess 271 extends through the light-transmitting medium 94, the first recess 271 can extend into or through the buried layer 90. A second recess 272 extends into the bottom of the first recess 271 such that the substrate 92 includes pillars 273 extending upward from the bottom of the second recess 272. Electrical contacts 274 are positioned in the bottom of the second recess 272. A first conductor 275 on the light-transmitting medium 94 is in electrical communication with the electrical contacts 274. A second conductor 276 on the on the light-transmitting medium 94 is positioned adjacent to the first recess 271. The first conductor 275 and the second conductor 276 are each in electrical communication with a contact pad 277 on the light-transmitting medium 94. The contact pads 277 can be used to provide electrical communication between electronics and the light source 10.

A laser chip 278 is positioned in the first recess 271 and on the pillars 273. The laser chip can be attached to the LIDAR chip using flip-chip technologies. Examples of suitable interfaces between laser chips and chips constructed from silicon-on-insulator wafer can be found in U.S. Pat. No. 9,705,278, issued on Jul. 11, 2017 and in U.S. Pat. No. 5,991,484 issued on Nov. 23, 1999; each of which is incorporated herein in its entirety.

The laser chip includes a resonant laser cavity configured to output a laser signal that is the source of the light for the outgoing light signal. The laser chip 278 includes a gain medium 279. A second conducting layer 280 is positioned on the gain medium 279. A third conductor 281 provides electrical communication between the second conducting layer 280 and the second conductor 276.

The laser chip 278 includes three ridges that extend into the second recess 272. The central ridge defines a portion of a gain waveguide 283. The outer ridges are each in electrical communication with one of the electrical contacts 274 through a conducting medium 293 such as solder or conducting epoxy. Since the first conductor 275 is in electrical communication with the electrical contacts 274, the first conductor 275 is in electrical communication with the outer ridges.

The laser signal can be generated from the gain medium 279 by driving an electrical current through the gain medium 279. The electrical current can be generated by applying a potential difference between the first conductor 275 and the second conductor 276. The potential difference can be provided by the electronics. The electronics can be included on the device or can be separate from the device but electrically coupled with the device.

The laser chip 278 includes a first reflecting structure 285 on the gain medium 279 and a second reflecting structure 286 on the gain medium 279. The first reflecting structure 285 and the second reflecting structure 286 can be selected to provide a resonant cavity such as a Fabry-Perot resonant cavity. For instance, the first reflecting structure 285 can have a higher reflectivity than the second reflecting structure 286. In one example, the first reflecting structure 285 is a highly reflecting structure such as a mirror and the second reflecting structure 286 is less reflective than the first reflecting structure 285 but is also partially transmissive. Suitable first reflecting structures 285 include, but are not limited to, a layer of metal on the layer of gain medium 279, or one or more dielectric layers configured as a high-reflectivity (HR) coating. Suitable second reflecting structures 286 include, but are not limited to, optical coatings on the layer of gain medium 279, or a cleaved or polished facet without a coating. The light from the resonant laser cavity exits the gain medium 279 through the second reflecting structures 286.

The gain medium 279 includes sub-layers 290 between a lower gain medium 292 and an upper gain medium 294. The lower gain medium 292 and the upper gain medium 294 can be the same or different. Suitable lower gain media 292 include, but are not limited to, InP, doped InP, gallium nitride (GaN), InGaAsP, and GaAs. Suitable upper gain media 294 include, but are not limited to, InP, InGaAsP, and GaAs. Different sub-layers 290 can have different compositions. For instance, each sub-layer 290 can have a different dopant and/or dopant concentration from the one or more neighboring sub-layers 290 and/or each of the sub-layers 290 can have a different dopant and/or dopant concentration. As an example, each sub-layer 290 can include or consists of two or more components selected from a group consisting of In, P, Ga, and As and different sub-layers 290 can have the elements present in different ratios. In another example, each sub-layer 290 includes or consists In, P and none, one, or two components selected from a group consisting of Al, Ga, and As and each of the different sub-layers 290 has these components in a different ratio. Examples of materials that include multiple elements selected from the above group include different compositions of InP with or without dopants such as $In(x)P(1-x)$ or In—Ga—As—P. Additionally, there may be other sub-layers 290 present to compensate for stress due to lattice mismatch between the compositions of the different sub-layers 290. The location of the laser mode in the laser ridge is defined by the different sub-layers 290 as a result of the refractive indices of the different compositions.

The electrical communication between the second conducting layer 280 and the second conductor 276 provided by the third conductor 281 can be achieved using traditional techniques such as wire bonding.

The laser chip is aligned with the utility waveguide 16 such that the utility waveguide receives the laser signal through an input facet 287. Although not illustrated, the input facet 287 can optionally include one or more anti-reflective coatings such as silicon nitride. The space between the input facet 287 and the laser cavity can be filled with a transmitting medium that is a solid or a fluid. For instance, the space between the second reflecting structure 286 and the input facet 287 can be filled with an epoxy, air, or gel. As a result, the laser signal can travel directly between the laser chip and the input facet 287 through the transmissive medium.

The input facet 287 for the utility waveguide 16 can be angled at less than ninety degrees relative to the direction of propagation in the utility waveguide 16. Angling the input facet 287 at less than ninety degrees can cause light signals reflected at the input facet 287 to be reflected out of the waveguide and can accordingly reduce issues associated with back reflection. Additionally or alternately, a facet of the gain waveguide 283 can be angled at less than ninety degrees relative to the direction of propagation in the gain waveguide 283.

FIG. 9F is a perspective view of a portion of the LIDAR chip that includes a portion of the utility waveguide 16 shown in FIG. 9A. The utility waveguide 16 includes a perturbation region 300 that receives the laser signal from the laser cavity and outputs a laser beam that can serve as an outgoing LIDAR signal in a LIDAR system. The utility waveguide 16 can carry the laser signal directly from the input facet 287 to the perturbation region 300. For instance, the utility waveguide 16 can exclude active components, inactive optical components, and waveguide branches between the input facet 287 and the perturbation region 300.

The perturbation region 300 includes one or more perturbation structures that each causes one or more perturbation(s) in the effective refractive index of the utility waveguide 16. The perturbation structures are external to the laser cavity but provide optical feedback to the resonant cavity that affects the output of the laser signal. For instance, the perturbation structures can provide a reflection of the laser signal such that output of the laser signal is different from what the laser signal would be in the absence of the perturbation structures. For instance, the laser beam output from the perturbation region 300 can be single mode while the laser signal output from the laser cavity would not be single mode in the absence of the perturbation region 300. The perturbation structures are selected to enhance the mode of the laser cavity that serves as the laser beam while suppressing side modes so as to provide a single mode laser beam.

In FIG. 9A and FIG. 9F, a ridge 96 of the light-transmitting medium extends away from slab regions 98 of the light-transmitting medium. The ridge 96 partially defines the utility waveguide 16. Recesses 240 extend into the top of the ridge 96 and each recess 240 acts as one of the perturbation structures 302. The recesses 240 are filled with a medium having a lower index of refraction than the light-transmitting medium 98. The medium can be a solid or a gas such as air. Accordingly, the recesses 240 provide perturbations in the effective refractive index of the outgoing LIDAR signal. The recesses 240 can be formed with photolithography combined with etching technologies such as wet etching and dry etching. Although the recesses 240 are shown in the top of the ridge, the recesses 240 can be in the side of the ridge and/or into the slab regions 98 next to the ridge 96.

Figure 9G:
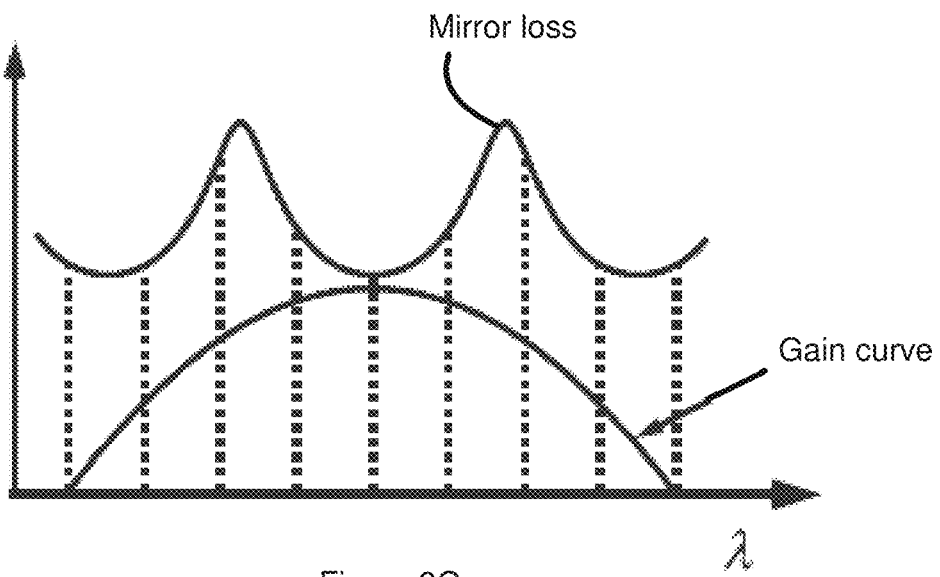

The effects of one of the perturbations on the outgoing LIDAR signal are illustrated in the graph of FIG. 9G. The "gain curve" labeled in FIG. 9G represents the gain provided by the gain medium minus the loss that occurs in the gain medium as a function of wavelength. In FIG. 9G, increased gain is shown as a positive value. The vertical lines represent wavelengths for the possible modes of the outgoing LIDAR signal. In the absence of the perturbation, the mode that intersect the gain curve at the highest point generally becomes the fundamental mode of the outgoing LIDAR signal while the other modes become the sidemodes.

The "mirror loss" labeled in FIG. 9G represents the level of optical loss associated with power outcoupling from the front facet of the second reflecting structure 286. The illustrated mirror includes the optical loss resulting from the laser signal exiting from the laser cavity. In FIG. 9G, a more positive mirror loss represents increased loss levels. The mirror loss plus any internal losses within a laser cavity are generally less than or equal to the level of optical gain that occurs in the laser cavity for a wavelength to lase in the laser cavity. Accordingly, increased "mirror loss" for a wavelength effectively represents suppression of that wavelength. As a result, the "mirror loss" curve illustrates that the perturbation increases suppression of certain wavelengths relative to other wavelengths.

The wavelength that will lase is the wavelength with the largest value of gain curve minus mirror loss. For instance, FIG. 9G shows the mirror loss curve positioned such that a minimum in the mirror loss is aligned with the peak in the gain curve and with one of the modes. As a result, the mode with the largest gain minus mirror loss value is the mode at the peak of the gain curve and this mode is output as the laser signal. The other modes are sidemodes that are suppressed by the perturbation structure.

Figure 9H:
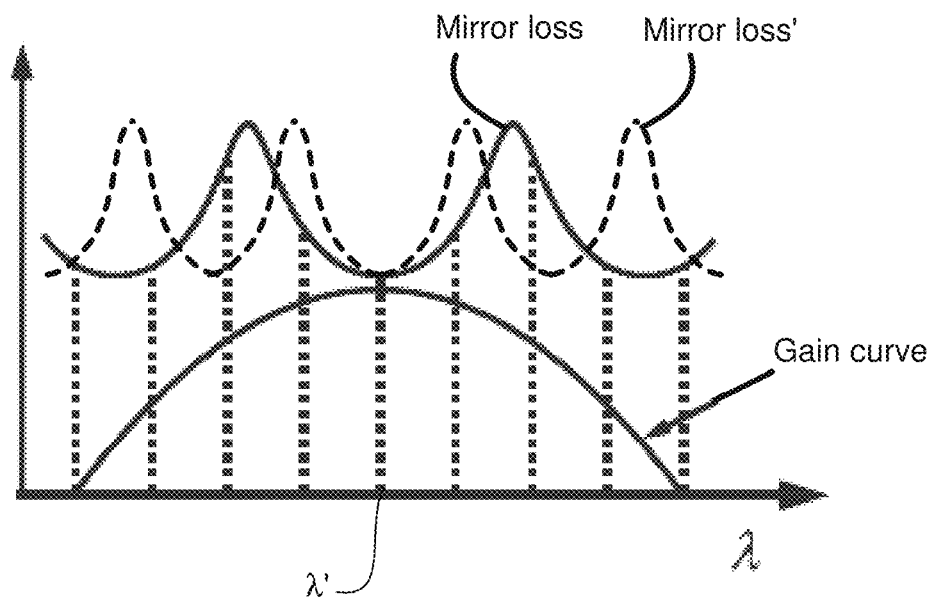
FIG. 9H is another graph comparing mirror loss caused by a perturbation with a gain curve for a laser.

Although FIG. 9G shows the mirror loss curve for a single perturbation structure 302, the light source can include multiple perturbation structures. The level of mirror loss provided by different perturbation structures is a vector sum including the phase of the incident and scattered light. As a result, the perturbation structures can be selected such that the mirror losses of the different perturbation structures constructively interfere to provide the laser beam with desired characteristics such as a desired wavelength. As an example, FIG. 9H shows FIG. 9G modified to include an additional mirror loss curve labeled "mirror loss'." The two mirror loss curves have a minima aligned at the desired wavelength labeled "λ'." Additionally, the wavelengths that are within the gain curve but are above or below λ' have higher mirror loss levels. As a result, the mode at λ' lases while sidemodes are suppressed. Accordingly, the perturbation structures can be selected to have mirror loss curves with co-located minima at or near the wavelength desired for the laser beam. In some instances, the perturbation structures are selected to have mirror loss curves with minima at or near the wavelength desired for the laser beam. For instance, all or a portion of the perturbation structures have mirror loss curves with a minimum in a wavelength range from the wavelength desired for the laser beam and the desired wavelength is within the gain curve. In some instances, the wavelength range is greater than or equal to 0.0 nm and/or less than 0.2 nm, or 0.5 nm. Additionally or alternately, all or a portion of the perturbation structures each has mirror loss curves with a minimum within 0.1 nm, 0.2 nm, or 0.5 nm of the desired wavelength and/or within 0.2 nm, 0.4 nm, or 1.0 nm of a minimum in the mirror loss curves in all or a portion of the other perturbation structures.

In some instances, the desired wavelength is a wavelength at or near the peak of the gain curve. For instance, all or a portion of the perturbations can have mirror loss curves with a minimum within 0.1 nm, 0.2 nm, or 0.5 nm from the wavelength at the peak of the gain curve. When the desired wavelength is a wavelength that is not at or near the peak of the gain curve, the mode selection provided by the perturbation structures can cause a mode with a wavelength that is remote from the peak of the gain curve to be output from the light source as the laser beam.

The characteristics of the perturbation structures can be altered to achieve the desired mirror loss curves. For instance, when the perturbation structures are the recesses shown in FIG. 9G, the physical characteristics of the recesses can be altered to achieve the desired mirror loss curves. The recess 240 extend into the ridge by a depth labeled $d_r$ and have a width labeled $r_w$. In some instances, the depth ($d_r$) is the same for all or a portion of the recesses 240 and/or the width ($r_w$) is the same for all or a portion of the recesses 240. Suitable depths ($d_r$) for the recesses include, but are not limited to, depths greater than 0.1 μm, 0.2 μm, or 0.3 μm and/or less than 0.4 μm, 0.5 μm, or 0.6 μm. Suitable widths ($r_w$) for the recesses include, but are not limited to, depths greater than 0.1 μm, 0.2 μm, or 0.3 μm and/or less than 0.5 μm, 0.75 μm, or 1.0 μm.

The centers of the recesses are separated by a separation distance labeled "sd." Suitable separation distances (sd) include, but are not limited to, distances greater than 0.22 μm, or 0.45 μm and/or less than 0.55 μm, or 0.65 μm. In contrast with optical gratings such as Bragg gratings, the recesses need not be positioned periodically along the utility waveguide. As a result, the separation distance is not a constant for the length of perturbation region 300. For instance, all or a portion of the pairs of adjacent perturbation structures can have different separation distances (sd). In some instances, the separation distances (sd) are represented by Equation 1: $sd_{i,\,i+1}=i*\gamma$ where γ is a constant and i is a perturbation structure index where the perturbation structures are each sequentially numbered with one of the perturbation structure indices and i starts at 1, $sd_{i,\,i+1}$ represents the separation distance (sd) between perturbation structure i and i+1. In some instance, $\gamma=m*\lambda/(4*n_{eff})$ where λ represents the free space wavelength of the outgoing LIDAR signal, $n_{eff}$ represents the effective index of refraction of the outgoing LIDAR signal in the utility waveguide, and m is an even integer. In some instances, $sd_{i,\,i+1}$ provides an approximation of the separation distances (sd). The separation distances need not be approximated by Equation 1 as the separation distances can be a function of the number of perturbation structures and their physical characteristics.

In some instances, the perturbation region is configured to narrow the linewidth of the laser beam. For instance, the displacement between the perturbation region and the laser cavity is labeled "ld" in FIG. 9A and the length of the laser cavity is labeled "$L_{LC}$" in FIG. 9A. Increasing the value of the displacement ("ld") plus the length ("$L_{LC}$") decreases the linewidth. As a result, the linewidth can be decreased by increasing the displacement ("ld"). For instance, the linewidth can be on the order of <100 kHz when the displacement ("ld") is on the order of few mm and the length ("$L_{LC}$") is on the order of few hundreds of μm. Suitable displacements ("ld") include, but are not limited to, displacements ("ld") greater than 0.1 mm, 1 mm, or 5 mm and/or less than 10 mm, 100 mm, or 1000 mm. Additionally or alternately, suitable lengths ("$L_{LC}$") include, but are not limited to, lengths ("$L_{LC}$") greater than 100 μm, 500 μm, or 1000 μm and/or less than 1500 μm, 2000 μm, or 5000 μm.

The length of the perturbation region 300 is labeled "pl" in FIG. 9A. In some instances, the length of the perturbation region 300 (pl) is greater than 0.2 μm, 0.45 μm, or 0.7 μm and/or less than 100 μm, 500 μm, or 2000 μm.

The portion of the perturbation region 300 illustrated in FIG. 9F is shown with only four recesses 240 in order to simplify the illustration. In some instances, the perturbation region 300 includes a number of perturbation structures that is greater than or equal to 3, 10, 50, or 200 and/or less than or equal to 500, 1000, or 2000. Increasing the number of perturbation structures can improve wavelength selectivity.

The wavelength of the minimum in a mirror loss curve can be shifted by changing the displacement between the perturbation region and the laser cavity and/or by changing the strength of the perturbations. For instance, the wavelength of the minimum in a mirror loss curve can be shifted by changing the value of the displacement between the perturbation region and the laser cavity labeled "ld" in FIG. 9A and/or by changing the depth of the recesses labeled "dr" in FIG. 9F. In particular, a minimum in a mirror loss curve can be shifted with respect to the gain peak by changing the displacement between the perturbation region and the laser cavity and/or by changing the strength of the perturbations. The distance between minima in a mirror loss curve can be shifted by changing the location of the perturbations. In particular, a distance between minima in a mirror loss curve can be increased by decreasing the displacement between the perturbation region and the laser cavity labeled "ld" or decreased by increasing the displacement between the perturbation region and the laser cavity labeled "ld." The magnitude of a mirror loss curve can be changed by changing the strength of the utility perturbations or reflectivity of the second reflecting structure 286. In particular, a difference between maxima in a mirror loss curve and a minima in the mirror loss curve can be increased by increasing the depth of the recesses labeled "dr" or number of perturbations or decreased by decreasing the depth of the recesses labeled "dr" or number of perturbations.

The enhancement of the mode that is the source of the outgoing LIDAR signal while suppressing the sidemodes decreases the linewidth of the outgoing LIDAR signal while increasing the Side Mode Suppression Ratio (SMSR) in the laser signal above the Side Mode Suppression Ratio (SMSR) that the laser cavity would have in the absence of the perturbation region. In some instances, the perturbation structures are selected to provide a linewidth greater than 100 Hz, 1 kHz, or 10 kHz and/or less than 100 kHz, 200 kHz, or 400 kHz. Additionally or alternately, the Side Mode Suppression Ratio (SMSR) of the laser signal can be greater than or equal to 25 dB, 30 dB, or 35 dB and/or less than or equal to 40 dB, 50 dB, or 60 dB. In some instances, the Side Mode Suppression Ratio (SMSR) of the laser signal and/or outgoing light signal is more than 10, 1,000, or 10,000 times the Side Mode Suppression Ratio (SMSR) of the laser signal in the absence of the perturbation region. In some instances, the linewidth of the outgoing LIDAR signal is less than 30 kHz while the linewidth of the laser signal in the absence of the perturbation region is more than 20 MHz and/or the Side Mode Suppression Ratio (SMSR) of the outgoing LIDAR signal is greater than 25 dB while the Side Mode Suppression Ratio (SMSR) of the laser signal in the absence of the perturbation region is less than 10 dB A light source constructed according to FIG. 9A through FIG. 9G is not a Distributed FeedBack (DFB) laser or an External Cavity Laser (ECL) since the primary source of optical power is the first reflecting structure 285 and the second reflecting structure 286. Additionally, the perturbation structures are located outside of the resonant laser cavity and select one of the modes that are output from the laser cavity. Additionally, the perturbation structures do not need to be included in a laser cavity or part of a laser cavity. As a result, the light source will not lase in the absence of the first reflecting structure 285 and the second reflecting structure 286.

EXAMPLE 1

A laser chip that included a Fabry-Perot laser cavity was interfaced with a utility waveguide to provide a light source constructed according to FIG. 9A through FIG. 9E. The utility waveguide had a ridge with a width (w) of 2.6 µm, a height (h) of 1.2 µm, and a slab thickness (T) of 1.8 µm. The utility waveguide had a perturbation region with 50 recesses that each served as a perturbation structure. The recesses each had a depth of 0.5 µm and width of 1 µm.

Although the laser cavity is disclosed as having one output, the laser cavity can include multiple outputs. For instance, the first reflecting structure 285 can be partially transmissive so as to provide the laser cavity with an additional output.

Although the light source is disclosed as having recesses used as perturbation structures, other perturbation structures are possible. Examples of other suitable perturbation structures include, but are not limited to, overlayers increasing the thickness of the waveguide, overlayers modifying the effective index of the waveguide through stress, or indiffused or implanted ion species.

Although the light source is disclosed in the context of a LIDAR system, the light source can be used in other applications such as sensing and imaging.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A laser system, comprising:
a laser cavity configured to output a laser signal;
a utility waveguide configured to receive the laser signal from the laser cavity,
the utility waveguide including a perturbation region that receives the laser signal and outputs a laser beam,
perturbation region including one or more perturbation structures that each causes one or more perturbations in an effective refractive index of the utility waveguide,
the perturbation structures being positioned along the utility waveguide such that a separation distance between adjacent perturbations structures is represented by $sd_{i,\,i+1} = i*\gamma$ where $\gamma$ is a constant and i represents an index sequentially assigned to the perturbation structures, $sd_{i,\,i+1}$ represents the separation distance between centers of perturbation structure assigned index values i and i+1, and there are at least 3 perturbation structures; and
the perturbation structures causing optical feedback to the laser cavity such that a power versus wavelength distribution in the laser beam is different from the power versus wavelength distribution that would be in the laser beam in the absence of the perturbation structures.

2. The system of claim 1, wherein the perturbation structures providing optical feedback to the laser cavity enhances one of multiple modes output by the laser cavity and suppresses other modes output by the laser cavity, the other modes being the modes included in the multiple modes in addition to the one mode.

3. The system of claim 1, wherein a linewidth of the laser beam is greater than 100 Hz and less than 100 kHz.

4. The system of claim 1, wherein a linewidth is less than 0.0001% of the linewidth that would occur in the absence of the perturbation regions.

5. The system of claim 1, wherein a Side Mode Suppression Ratio of the laser beam is greater than 25 dB.

6. The system of claim 1, wherein the Side Mode Suppression Ratio (SMSR) of the laser signal is greater than 10 times the SMSR that the laser signal would have in the absence of the perturbation region.

7. The system of claim 1, wherein the laser cavity is a Fabry-Perot laser cavity.

8. The system of claim 1, wherein the utility waveguide carries the laser signal directly from a facet of the utility waveguide to the perturbation region.

9. The system of claim 1, wherein a distance between the laser cavity and one of the perturbation structures that is located closest to the laser cavity is less than 100 mm.

10. The system of claim 1, wherein the perturbation structures are arranged non-periodically along the utility waveguide.

11. The system of claim 1, wherein the laser cavity includes a gain medium optically between a first reflecting structure and a second reflecting structure and is configured such that the laser would not the lase in the absence of the first reflecting structure and the second reflecting structure.

12. The system of claim 1, wherein the perturbation structures are recesses in the utility waveguide.

13. The system of claim 12, wherein the utility waveguide is a ridge waveguide on a silicon-on-insulator wafer.

14. The system of claim 1, wherein light from the laser beam is included in a LIDAR output signal, the laser system is configured to receive a LIDAR input signal that includes light from the LIDAR output signal after the LIDAR output signal was reflected by an object located outside of the LIDAR system, and electronics configured to extract LIDAR data from the LIDAR input signal.

15. The system of claim 1, wherein the perturbation structures each has a mirror loss curve with a minimum within 1.0 nm of a minimum in a mirror loss curve of the other perturbation structures.

16. The system of claim 1, wherein the separation distances are greater than 0.22 μm and less than 0.65 μm.

17. The system of claim 1, wherein $\gamma=m*\lambda/(4*n_{eff})$ where $\lambda$ represents a free space wavelength of the laser beam, $n_{eff}$ represents an effective index of refraction of the laser beam in the utility waveguide, and m is an even integer.

* * * * *